(12) United States Patent  
Yamagishi

(10) Patent No.: US 6,454,516 B1  
(45) Date of Patent: Sep. 24, 2002

(54) SEMICONDUCTOR SUBSTRATE ALIGNER APPARATUS AND METHOD

(75) Inventor: Takayuki Yamagishi, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 09/612,739

(22) Filed: Jul. 10, 2000

(30) Foreign Application Priority Data

Jul. 8, 1999 (JP) .......................................... 11-195087  
Jul. 30, 1999 (JP) .......................................... 11-217348

(51) Int. Cl.⁷ ............................................. B65G 49/07  
(52) U.S. Cl. ........................ 414/754; 414/936; 198/394  
(58) Field of Search ................................ 414/757, 936; 198/394

(56) References Cited

U.S. PATENT DOCUMENTS 2,957,252 A * 10/1960 Pain ........................... 211/1.51  
3,389,778 A * 6/1968 Kovacs et al. ............... 198/394  
3,972,424 A * 8/1976 Levy et al. .................. 214/1 Q  
3,982,627 A * 9/1976 Isohata ....................... 214/1 Q  
4,242,038 A * 12/1980 Santini et al. ............... 414/755  
4,377,038 A * 3/1983 Ragan ..................... 33/203.18  
4,441,853 A * 4/1984 Kosugi ........................ 414/757  
4,685,206 A * 8/1987 Kobayashi et al. .......... 198/394  
4,887,904 A * 12/1989 Nakazato et al. ............ 356/375  
5,037,262 A * 8/1991 Moll et al. ................... 414/222  
5,052,886 A * 10/1991 Moroi ......................... 198/394  
5,085,558 A * 2/1992 Engelbrecht ................. 414/786  
5,385,186 A * 1/1995 Head et al. ................ 144/242.1  
5,551,829 A * 9/1996 Jerolimov et al. ........... 198/394  
5,566,466 A * 10/1996 Hearne .......................... 34/58  
5,662,452 A * 9/1997 Allison ........................ 198/394  
5,840,129 A * 11/1998 Saenz et al. ................... 134/2  
5,851,041 A * 12/1998 Anderson et al. ............ 294/106  
5,853,284 A * 12/1998 Ohzeki et al. ............... 414/757  
5,880,479 A * 3/1999 Wang .......................... 250/548  
6,131,589 A * 10/2000 Vogtmann et al. .......... 134/113  
6,213,011 B1 * 4/2001 Dubuit ......................... 101/35  
6,270,307 B1 * 8/2001 Sinha .......................... 414/754  
6,302,317 B1 * 10/2001 Narita et al. .............. 228/179.1  
6,357,996 B2 * 3/2002 Bacchi et al. ................ 414/754

FOREIGN PATENT DOCUMENTS

| JP | 362273747 | * 11/1987 | ................. 414/936 |
| JP | 63086447 A | * 4/1988 | ................. 414/936 |
| JP | 3-116039 | 12/1991 | |
| JP | 404157756 A | * 5/1992 | ................. 414/936 |
| JP | 09-246357 | 9/1997 | |

* cited by examiner

Primary Examiner—Donald P. Walsh  
Assistant Examiner—Jeffrey A. Shapiro  
(74) Attorney, Agent, or Firm—Knobbe, Martens, Olson and Bear, LLP

(57) ABSTRACT

There is provided an aligner apparatus and method which can align a semiconductor substrate without contaminating a rear surface. The aligner apparatus for arbitrarily aligning the circular semiconductor substrate having a notch or "orifla" at an edge portion includes at least three spindle units rotatably axially supported by a plate, holding units for holding the semiconductor substrate, attached to respective tip ends of the spindle units, a rotation mechanism for rotating the spindle units, and a sensor for detecting the notch or "orifla". An edge portion of the semiconductor substrate is brought into contact with the respective holding units, so that the semiconductor substrate is held. When the spindle units rotate, the semiconductor substrate held by the holding units rotates around its axial line.

11 Claims, 3 Drawing Sheets

SEMICONDUCTOR SUBSTRATE ALIGNER APPARATUS AND METHOD

BACKGROUND OF THE INVENTION

1. Field of the Invention

The present invention relates to an apparatus for arbitrarily aligning a semiconductor substrate, and particularly to an apparatus and method for aligning a notch or orientation flat (hereinafter referred to as "orifla") provided at an edge portion of a semiconductor substrate to an arbitrary position.

2. Description of the Related Art

Conventionally, there has been used an apparatus for aligning a notch or "orifla" of a semiconductor substrate to an arbitrary position during conveyance of the semiconductor substrate in a semiconductor manufacturing apparatus or between semiconductor apparatuses. Normally, in such an apparatus, a vacuum suction apparatus is vacuum clung to a rear surface of a semiconductor substrate and rotates the semiconductor substrate so that a notch or "orifla" reaches an arbitrary position.

However, with a demand for ultra fineness and high density in a device in recent years, particle contamination of a rear surface of a semiconductor substrate has become a problem.

In the method using the vacuum suction apparatus, the rear surface of the semiconductor substrate is contaminated by the dirt of a vacuum pat, particles produced from that, reverse diffusion of particles from the vacuum suction apparatus, or the like.

SUMMARY OF THE INVENTION

An object of the present invention is therefore to provide an aligner apparatus and method in which a notch or "orifla" can be aligned to an arbitrary position without contaminating a rear surface of a semiconductor substrate.

Another object of the present invention is to provide an aligner apparatus and method in which alignment is quickly completed by a simple structure and an aligned semiconductor substrate can be accurately conveyed.

A device of the present invention to achieve the foregoing objects is an aligner apparatus for arbitrarily aligning a circular semiconductor substrate having a notch or "orifla" at an edge portion. This apparatus includes at least three spindle means rotatably axially supported by a plate, holding means for holding the semiconductor substrate, attached to respective tip ends of the spindle means, a rotation mechanism for rotating the spindle means, and a sensor for detecting the notch or "orifla".

An edge portion of the semiconductor substrate is brought into contact with the respective holding means, so that the semiconductor substrate is held. When the spindle means are rotated, the semiconductor substrate held by the holding means is also rotated around its axial line.

The holding means includes a taper-shaped roller portion, so that it can quickly and certainly come in contact with the edge portion of the semiconductor substrate.

The roller portion preferably includes a guide portion of a spherical or taper shape at a tip end in its axial direction, and the semiconductor substrate can be guided to the roller portion by this guide portion.

It is desirable that the holding means is attached to the tip end of the spindle means movably only in the axial direction, and an elastic member intervenes between the holding means and the spindle means.

The rotation mechanism preferably includes a pulse motor for rotating the spindle means, and the rotation of the pulse motor is controlled by a signal from the sensor.

The sensor detects the notch or "orifla" of the semiconductor substrate, and transmits the signal to the pulse motor so as to rotate the semiconductor substrate until the notch or "orifla" reaches a predetermined position.

In a method of the present invention for arbitrarily aligning a semiconductor substrate by using the foregoing apparatus of the present invention, the semiconductor substrate is first conveyed to a position where the edge portion is brought into contact with the respective holding means. Next, the rotation mechanism is started to rotate the spindle means, and the semiconductor substrate held by the holding means is rotated around the axial line. The sensor detects the notch or "orifla". On the basis of the detected signal, the spindle means is rotated by the rotation mechanism, and the semiconductor substrate is rotated to the predetermined position. In this way, alignment of the semiconductor substrate is completed.

DETAILED DESCRIPTION OF THE PREFERRED EMBODIMENT

The present invention will be described below with reference to the drawings.

Figure 1:
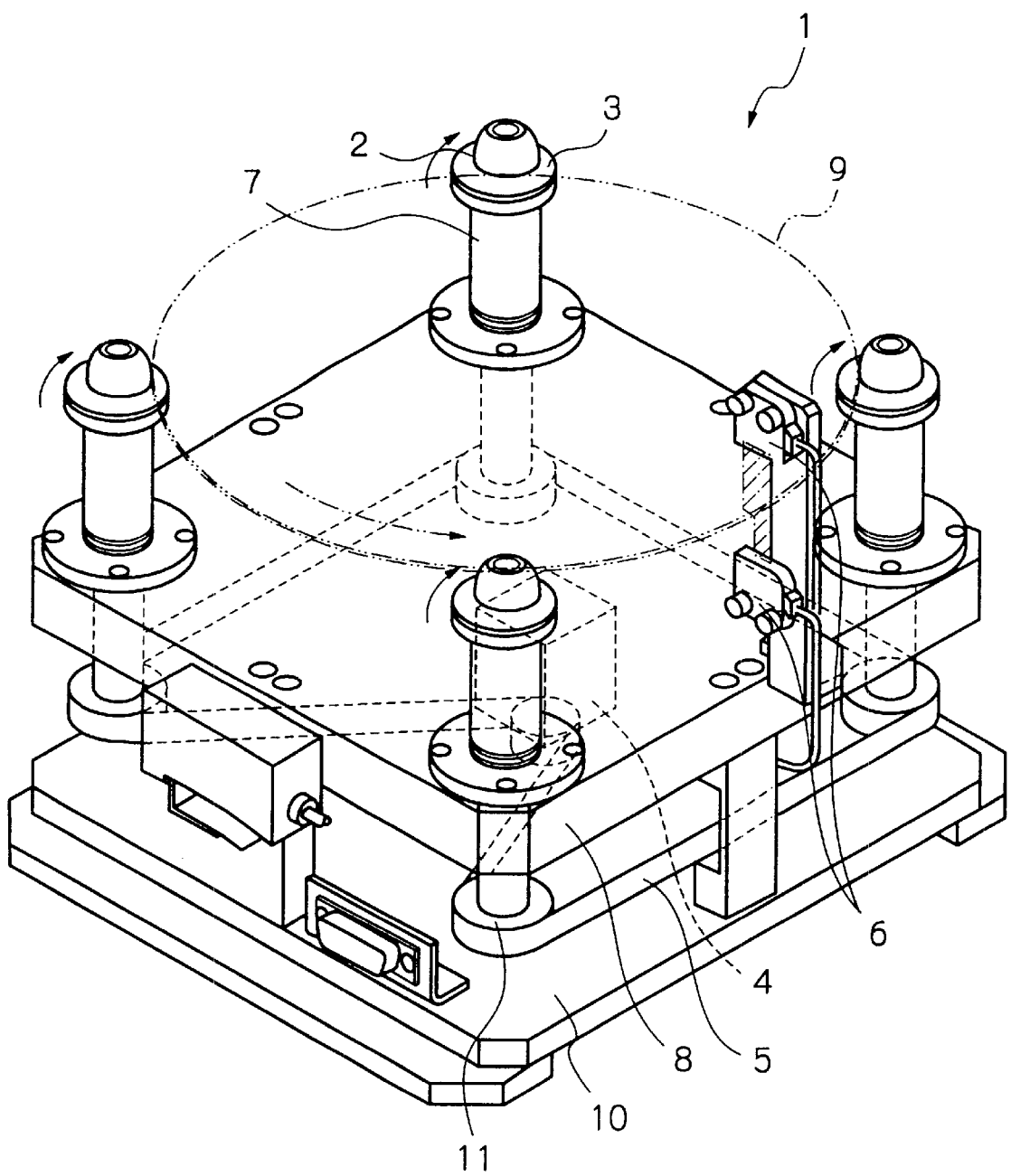
FIG. 1 is a perspective view of a preferred embodiment of the present invention.
Figure 2:
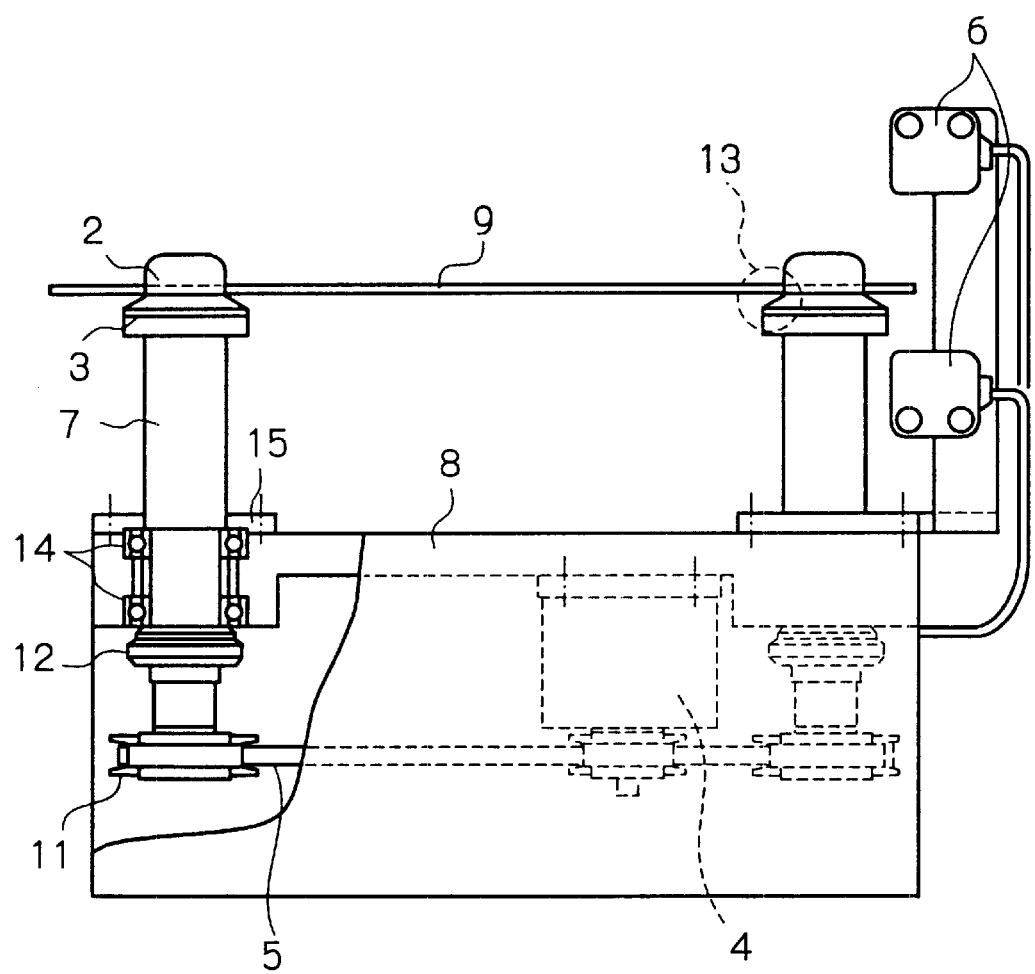
FIG. 2 is a perspective view of the preferred embodiment of the present invention.

FIGS. 1 and 2 are a perspective view and a side view of a preferred embodiment of an aligner apparatus of the present invention.

In this aligner apparatus 1, a plate 8 is fixed to a pedestal 10 through a leg portion 10' (in FIG. 1, one at this side is shown). This pedestal 10 is for only setting the plate 8, relevant control apparatus, and the like, and be comes unnecessary when the aligner apparatus is directly installed in a semiconductor manufacturing apparatus.

Four spindles 7 are axially supported at approximately four corners of the plate 8. As described below, the spindles 7 are located at positions where they can support a circular semiconductor substrate 9. As is well shown in FIG. 2, the spindle 7 is attached to the plate 8 through a bearing 14 provided in a hole bored in the plate 8.

A nut 12 is attached to a lower portion of the spindle 7 protruding from the hole of the plate 8, and a cover 15 is attached to its upper portion. In this way, the spindle 7 is rotatably axially supported by the plate 8.

Holding means is provided at a tip end of each of the spindles 7. This holding means includes a guide portion 2 of a spherical or taper shape, and a roller 3 continued from this and having a taper-shaped shoulder portion 13.

As shown in the drawing, the semiconductor substrate 9 is held, while its edge portion is brought into contact with the taper-shaped shoulder portion 13 of the roller 3 of the holding means provided on each of the spindles 7. When the semiconductor substrate 9 is conveyed to the shoulder portion 13 by conveying means (not shown), even if a little position error exists at that time, it is guided to the shoulder portion 13 a long the sloped side of the guide portion 2.

Since the guide portion is provided for this, if the conveying means can dispose the semiconductor substrate 9 to each of the shoulder portions 13 of the rollers the guide portion becomes unnecessary.

As set forth above, when the semiconductor substrate 9 is disposed to each of the should portions 13 of the rollers 3 of the holding means, and the spindles 7 are rotated to rotate the rollers 3 of the holding means, interlocking with the rotation, the semiconductor substrate 9 being in contact with and supported by the should portions 13 can also be rotated around the axial line.

Like this, since the roller 3 comes in contact with the edge portion of the semiconductor substrate 9, and transmits the rotation of the roller 3 to the semiconductor substrate 9, it is desirable that a rubber lining is provided in order to reduce damage at the contact and to prevent a slip between both during the rotation.

As set forth above, since the holding means is for holding and rotating the semiconductor substrate 9, at least three holding means are sufficient (the number of the spindles to which they are attached is also the same).

Incidentally, in the case where the number of the holding means (that is, spindles) is three, the edge portion of the semiconductor substrate 9 comes in contact with the roller 3 of each of the holding means. However, when the number is four or more, there is a case where some roller 3 does not come in contact with the edge portion of the semiconductor substrate. In such a case, it becomes hard to transmit the rotation of the spindle to the semiconductor substrate through the holding means, and the rotation of the semiconductor substrate becomes unstable.

In order to prevent such a thing, it is desirable that a floating mechanism is provided for at least one holding member.

Figure 3:
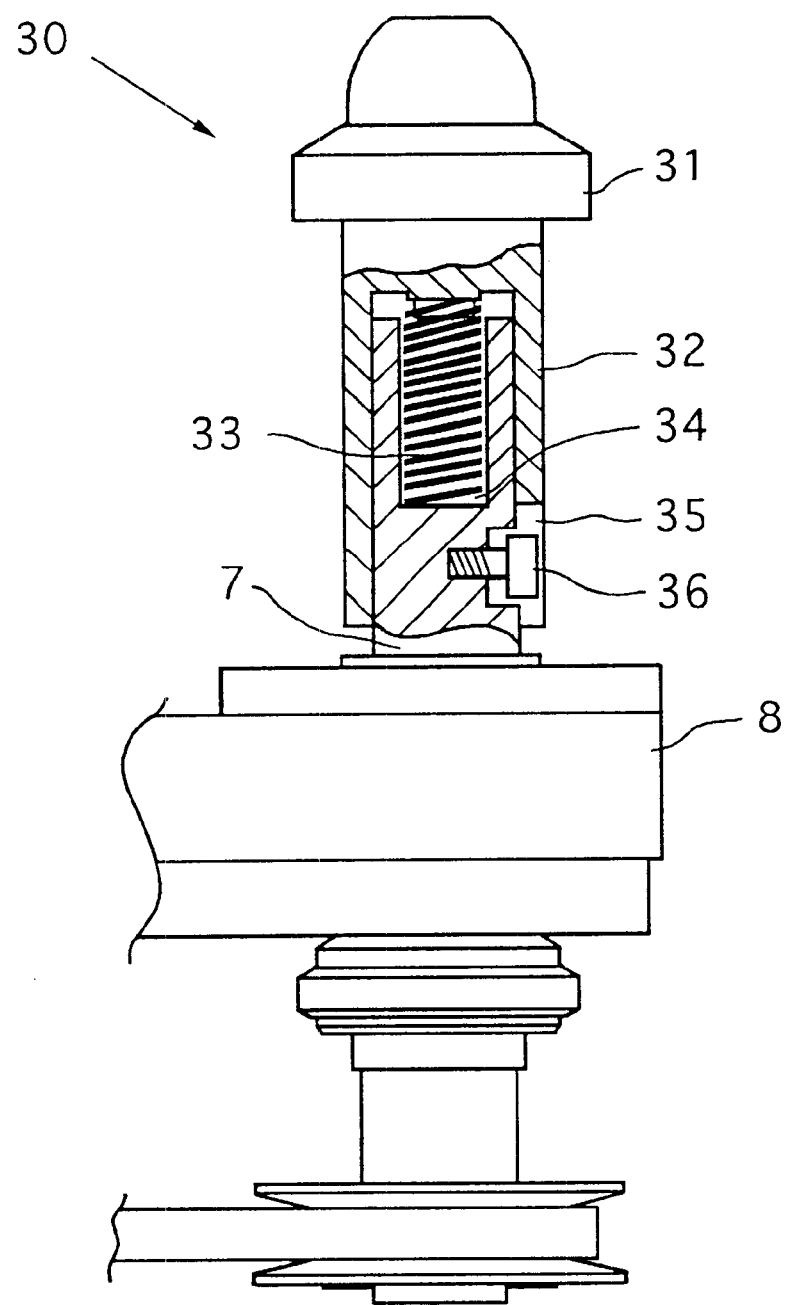
FIG. 3 is a partially cutaway side view of holding means including a floating mechanism and a spindle.

This floating mechanism is schematically shown in FIG. 3.

A hollow cylindrical portion 32 capable of housing the upper portion of the spindle 7 extends downward from a roller 31 of holding means 30 including this floating mechanism. On the other hand, a hole 34 capable of housing a spring 33 is formed in the inside of a tip end of the spindle 7.

The spring 33 performs an action to push up the holding means 30 when the holding means 30 is pushed down.

A groove 35 is formed along an axial line on the side of the cylindrical portion 32 so that although the cylindrical portion 32 can move in the axial direction with respect to the spindle 7, they can not rotate relatively to each other, and a guide pin 36 passing through the groove 35 and preventing the relative rotation is fixed to the spindle 7.

When this floating mechanism is installed in, for example, one holding means, the holding means protrudes upward from other holding means. Thus, the conveyed semiconductor substrate first comes in contact with the roller of the holding means having the floating mechanism. Although the roller goes down by the weight of the semiconductor substrate until the edge portion of the semiconductor substrate comes in contact with the roller of other holding means, the roller continues to be in contact with the edge portion of the semiconductor substrate by the repulsive force of the spring 33, and therefore, all rollers can come in contact with the edge portion of the semiconductor substrate.

As is well shown in FIG. 2, a pulley 11 is attached to a lower end of each of the spindles 7. A timing belt 5 is hung on the pulley 11. The timing belt 5 is hung also on a pulse motor 4 fixed to the rear surface of the plate 8. Thus, when the pulse motor 4 is started, the four spindles are rotated through the timing belt 5. Thus, the rotation of the pulse motor 4 is transmitted in synchronization with the respective spindles.

The rotation of the pulse motor 4 may also be transmitted to the spindles by using a gear instead of the timing belt.

In the embodiment shown in the drawings, although the four spindles are rotated by using the timing belt, by rotating one spindle (in this case, the timing belt becomes unnecessary), it is also possible to rotate the semiconductor substrate positioned thereon. However, for more certain rotation, it is desirable that two spindles positioned diagonally are rotated (in this case, a timing belt is hung on the spindles to be rotated).

As shown in FIG. 1, when the semiconductor substrate 9 is disposed on the four rollers 3, in order to detect a notch or "orifla" at the edge portion of the semiconductor substrate 9, a sensor 6 is set above and below the edge portion of the semiconductor substrate 9. A part of light emitted from the upper element of the sensor is blocked off by the semiconductor substrate (in FIG. 1, indicated by a plane depicted by a one-dot-chain line). The semiconductor substrate rotates and when the notch or "orifla" passes through the place of the sensor 6, the amount of blocked light is changed, and this is detected by the lower element. In this way, the position of the notch or "orifla" of the semiconductor substrate is detected by the sensor.

After detecting the notch or "orifla" of the semiconductor substrate 9, the sensor 6 transmits a signal to the pulse motor 4, and the pulse motor 4 makes a predetermined number of rotations through pulse control. The rotation is transmitted to the spindle 7 through the timing belt, the roller of the holding means attached to the spindle is rotated, and the semiconductor substrate 9 is interlocked with the roller 3 and is rotated until the notch or "orifla" reaches a predetermined position.

Although the one sensor 6 is provided in this embodiment, a plurality of sensors may be provided.

Next, a method of arbitrarily aligning a semiconductor substrate will be described.

First, the semiconductor substrate 9 is conveyed by conveying means (not shown) to the upper vicinity of the holding means. Next, the conveying means slowly falls vertically downward, and the semiconductor substrate 9 is inserted between the guide portions 2. The guide portion 2 guides the semiconductor substrate 9 to the taper-shaped shoulder portion 13 of the roller 3. Even if a position shift slightly occurs when the semiconductor substrate is inserted between the guide portions, the semiconductor substrate is guided by the guide portion and is put on the roller. This means that centering of the semiconductor substrate is also performed.

When the pulse motor 4 is driven, the four spindles 7 are synchronously rotated through the timing belt 5. Thus, the holding means provided to the spindle is also rotated, and interlocking with the rotation, the semiconductor substrate 9 thereon rotates around the axial line.

When the notch or "orifla" of the semiconductor substrate 9 passes through the place of the sensor 6, the sensor 6 detects that. Then, a signal for causing a certain number of rotations necessary for the notch or "orifla" to reach the predetermined position is transmitted to the pulse motor 4.

The conveying means may stand by at a lower side of the semiconductor substrate 9, while the semiconductor substrate 9 is interlocked with the rotation of the holding means and is rotated.

When the pulse motor 4 makes the predetermined number of rotations, the notch or "orifla" reaches the predetermined position, and alignment of the semiconductor substrate is completed. The conveying means goes up, and can move the semiconductor substrate 9 to a next processing step while supporting the aligned and centered semiconductor substrate 9.

According to the present invention, since alignment of a semiconductor substrate is carried out without surface contact with the rear surface of the semiconductor substrate, the problem of particle contamination of the rear surface of the semiconductor substrate by vacuum suction has been solved.

Besides, since centering can also be made at the same time as the alignment of the semiconductor substrate, next conveyance of the semiconductor substrate can also be accurately made.

What is claimed is:

1. An apparatus for positioning a circular semiconductor substrate having a notch or orientation flat at its end, comprising:

at least three spindles rotatably axially supported by a plate, each spindle having a tip end, said spindles being positioned where the outer periphery of a semiconductor substrate is to be located when loaded;

holders attached to the respective tip ends of said spindles, each holder including a tapered-end roller for contacting the edge of the semiconductor substrate to retain the semiconductor substrate when loaded, wherein at least one of said holders is attached to the tip end of the spindle moveably only in its axial direction, and the holder has a floating mechanism which provides a repulsive force to the weight of the semiconductor substrate;

a rotator for synchronizing rotation of said spindles to rotate the semiconductor substrate when retained with said holders; and a sensor for detecting said notch or orientation flat, said sensor providing a signal to said rotator to position the semiconductor substrate in a predetermined position.

2. The apparatus according to claim 1, wherein said roller includes a guide of a spherical or taper shape at the tip end in its axial direction.

3. The apparatus according to claim 1, wherein the rotator includes a pulse motor for rotating the spindles, and rotation of said pulse motor is controlled by a signal from the sensor.

4. The apparatus according to claim 3, wherein said rotator further includes a pulley provided for each of said spindles, and a timing belt hung on the pulley, wherein rotation of the pulse motor is transmitted to said pulley through the timing belt.

5. The apparatus according to claim 3, wherein after the sensor detects the notch or orientation flat of the semiconductor substrate, the sensor transmits a signal to the pulse motor to rotate the semiconductor substrate until the notch or orientation flat reaches the predetermined position.

6. A method for positioning a semiconductor substrate by using an apparatus including (i) at least three spindles rotatably axially supported by a plate, each spindle having a tip end, (ii) holders fixed to the respective tip ends of said spindles, each holder including a tapered-end roller for contacting the edge of the semiconductor substrate to retain the semiconductor substrate when loaded, (iii) an elastic member inserted between said holder and said spindle, (iv) a rotator for rotating said spindles, and (v) a sensor for detecting a notch or orientation flat at the edge of said semiconductor substrate, the method comprising the steps of:

conveying said semiconductor substrate to a position where its edge is brought into contact with the respective holders;

rotating said semiconductor substrate held by the holders around its axial line by starting said rotator to rotate said spindles;

detecting the notch or orientation flat by the sensor; and positioning said semiconductor substrate in a predetermined position by stopping the rotator in accordance with the detection signal.

7. The method according to claim 6, wherein the rotator includes a pulse motor for rotating said spindles, and rotation of said pulse motor is controlled by a signal from the sensor.

8. The method according to claim 7, wherein the sensor detects said notch or orientation flat and transmits the signal to said pulse motor so that the semiconductor substrate is rotated until the notch or orientation flat reaches the predetermined position.

9. The method according to claim 7, further comprising conveying said semiconductor substrate by a substrate conveyer to a position where the edge of the semiconductor substrate is brought into contact with the respective holders.

10. The method according to claim 9, wherein said substrate means conveyer conveys the semiconductor substrate to the holders and then stands by in the position.

11. The apparatus according to claim 1, wherein the floating mechanism includes an elastic member between the holder and the spindle.

* * * * *